United States Patent [19]

Otani et al.

[11] Patent Number: 5,690,732
[45] Date of Patent: Nov. 25, 1997

[54] METHOD OF AUTOMATICALLY GROWING A SINGLE CRYSTAL

[75] Inventors: Shigeki Otani; Takaho Tanaka; Yoshio Ishizawa, all of Tsukuba, Japan

[73] Assignee: National Institute for Research in Inorganic Materials, Tsukuba, Japan

[21] Appl. No.: 891,914

[22] Filed: Jun. 1, 1992

Related U.S. Application Data

[63] Continuation of Ser. No. 725,898, Jul. 1, 1991, abandoned, which is a continuation of Ser. No. 469,053, Jan. 23, 1990, abandoned.

[30] Foreign Application Priority Data

Jan. 26, 1989 [JP] Japan ................................. 1-17076
Aug. 30, 1989 [JP] Japan ................................. 1-223748

[51] Int. Cl.$^6$ ................................................. C30B 15/20
[52] U.S. Cl. ................................. 117/14; 117/13; 117/15; 117/201

[58] Field of Search ................................. 156/601, 620.7, 156/620.73; 422/250

[56] References Cited

U.S. PATENT DOCUMENTS

| 4,220,839 | 9/1980 | De Leon | 156/620.73 |
| 4,292,487 | 9/1981 | De Leon | 156/620.73 |
| 4,619,811 | 10/1986 | Nishizawa | 156/601 |

*Primary Examiner*—Felisa Garrett
*Attorney, Agent, or Firm*—Oblon, Spivak, McClelland, Maier Neustadt, P.C.

[57] ABSTRACT

A method of automatically growing a single crystal by using a floating-zone method in which radio-frequency induction heating is utilized, wherein the shape of molten zone of a sintered rod material is judged by comparing an anode voltage in a radio-frequency oscillation tube with a radio-frequency current, or a change in the shape of molten zone is judged depending of a change in a radio-frequency current during the growth of the sintered rod material, and power for heating is controlled on the basis of the judgement.

4 Claims, 1 Drawing Sheet

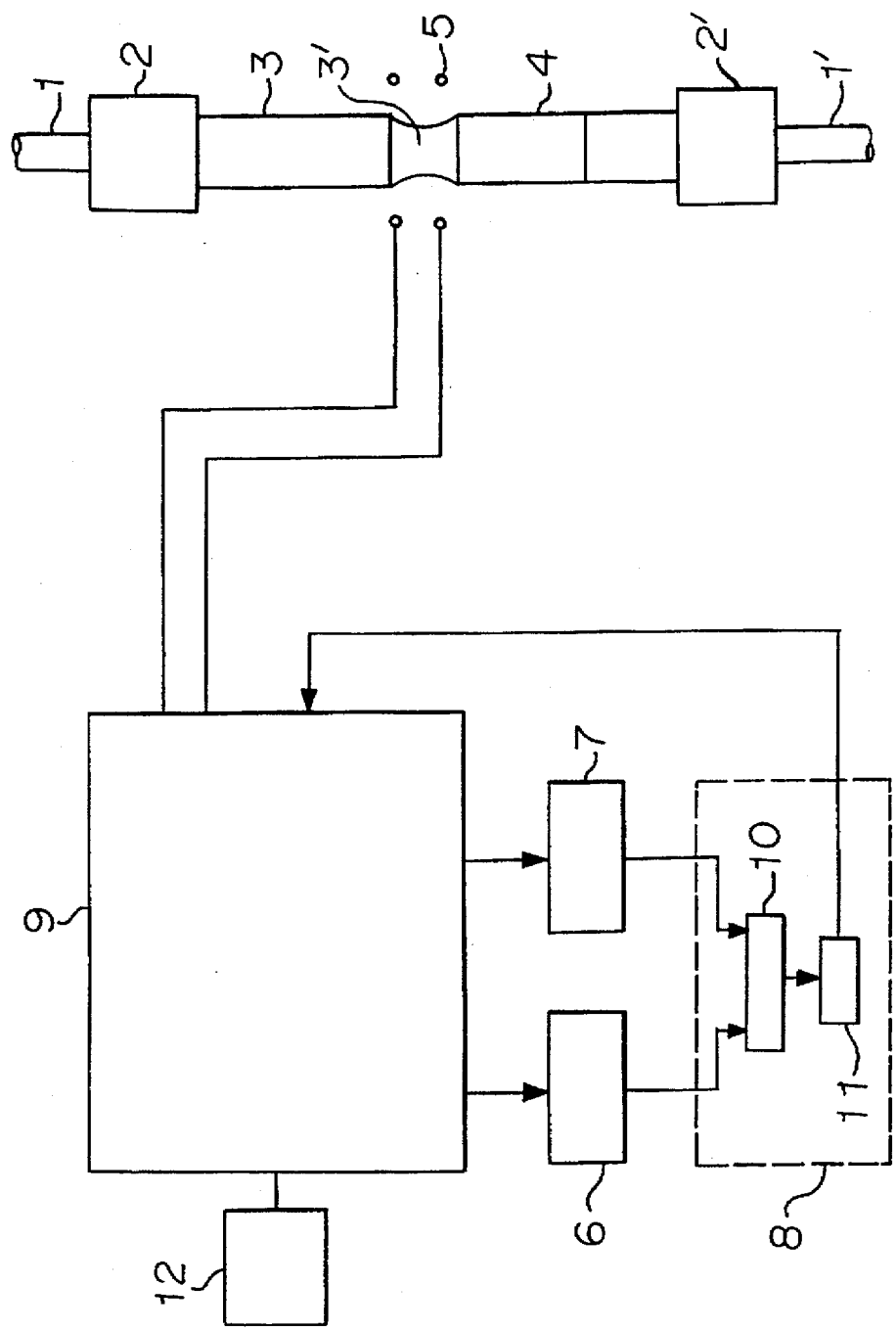

METHOD OF AUTOMATICALLY GROWING A SINGLE CRYSTAL

This application is a continuation application of U.S. patent application Ser. No. 07/725,898, filed on Jul. 1, 1991 now abandoned, which is a continuation of U.S. patent application Ser. No. 07/469,053 filed on Jan. 23, 1990 and previously abandoned.

BACKGROUND OF THE INVENTION

1. Field of the Invention

The present invention relates to a method of automatically growing a single crystal by using a floating-zone method (hereinbelow, referred to as an 'FZ method') in which radio-frequency induction heating is utilized.

2. Discussion of Background

An FZ method by utilizing radio-frequency induction heating is optimally used for growing a single crystal of a material having high melting point since it is unnecessary to use a crucible and the material itself becomes a heating element.

Recently a single crystal of $LaB_6$ (having a melting point of 2,600° C.) which is a thermionic emission material is grown by such method and is widely used. Further, a single crystal of TiC (having a melting point of 3,100° C.) which is noted as a field electron emission material is grown by the above-mentioned method. Recently materials durable to severe condition of use are required, and a method of growing a single crystal by utilizing a radio-frequency heating FZ method becomes important.

When a single crystal is formed by radio-frequency heating FZ method, the shape of molten zone of a material to be heated is changed upon heating. Accordingly, it is difficult to obtain a single crystal of high quality unless the shape of molten zone is controlled. In the conventional FZ method, however, since a device such as a load cell which is used to grow a single crystal by a pulling method and which can optimally detect a state of the growing of the single crystal is not available, it has been necessary that an operator manually controls power for heating to be an optimal value while he observes the shape of molten zone of the material through his eyes so that a preferred single crystal is obtained. Therefore, there has been difficult to control mildly temperature by manual controlling operations, and the quality of thus produced single crystal is reduced. Further, there is scattering in quality of the single crystals.

The inventors of this application have made intensive study, and have found that it is important to keep the shape of molten zone of a material from which a single crystal is obtainable to be constant and that a change in the shape of the molten zone is resulted from a change in the optimum value of power for heating, and such change can be judged in the correlation of an anode voltage and a radio-frequency current for heating the molten zone. As a result, it has become possible to automatically grow a single crystal by detecting the anode voltage and the radio-frequency current during the growing of the single crystal, by judging the shape of the molten zone of the material by using a computer, and by controlling power for heating on the material on the basis of the judgement by the computer.

Further, the change of the shape of the molten zone can be judged by detecting a change in the radio-frequency current for heating the molten zone. Accordingly, it has become possible to automatically grow a single crystal by judging the change of the shape of the molten zone by detecting a change in the radio-frequency current-during the growing of the single crystal by using a computer and by controlling power for heating.

SUMMARY OF THE INVENTION

It is an object of the present invention to provide a method of automatically growing smoothly a single crystal by using a floating-zone method in which radio-frequency induction heating is utilized while controlling temperature for heating the single crystal.

According to the present invention, there is provided a method of automatically growing a single crystal by using a floating-zone method in which radio-frequency induction heating is utilized, characterized in that the shape of molten zone is judged by comparing an anode voltage in a radio-frequency oscillation tube with a radio-frequency current, and power for heating is controlled on the basis of the judgment.

In accordance with the present invention, there is provided a method of automatically growing a single crystal by using a floating-zone method in which radio-frequency induction heating is utilized, characterized in that a change in the shape of molten zone is judged depending of a change in a radio-frequency current during the crystal growth, and power for heating is controlled on the basis of the judgment.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a diagram showing an embodiment of a single crystal growing furnace used for the method of the automatically growing a single crystal according to the present invention.

DETAILED DESCRIPTION OF THE PREFERRED EMBODIMENTS

Preferred embodiments of the present invention will be described in more detail.

FIG. 1 shows schematically an embodiment of a single crystal growing furnace used for the method of the present invention, wherein a reference numeral 1 designates an upper shaft, a numeral 1' designates a lower shaft, numerals 2, 2' designate holders, a numeral 3 designates a sintered rod material, a numeral 3' designates a molten zone, a numeral 4 designates a single crystal produced from the sintered rod material, a numeral 5 designates a radio-frequency work coil, numerals 6, 7 desintate respectively measuring devices for detecting an anode voltage and a radio-frequency current, a numeral 8 designates a computer, a numeral 9 designates a radio-frequency generator (an oscillating tube), a numeral 10 designates an operating unit and a numeral 11 designates a control unit.

In the above-mentioned construction, the sintered rod material 3 as a raw material from which a single crystal is obtained is attached to the upper shaft 1 by means of the holder 2. Then, a single crystal or a sintered rod material which functions as a material capable of forming at the initial stage a molten zone at the initial stage is fixed to the holder 2' so that the single crystal is in alignment with and in contact with the lower part of the sintered rod material. Then, inert gas such as Ar, He or the like is filled in the growing furnace at a several atmospheric pressure. Electric power is supplied to the radio-frequency coil 5 so that the molten zone 3' is produced in the molten zone producing material by induction heating. Then, the upper and lower shafts 1, 1' are slowly moved downwardly at a rate of 0.2–5 cm/hr so that the growing of the single crystal is started. The above-mentioned technique is the same as the conventional method.

When the molten zone has been moved by about 5 mm after the starting of moving the molten zone, the method of automatically growing a single crystal according to the present invention is conducted. In this case, however, an ideal shape of the molten zone during the growing is such as shown by the reference numeral 3' in FIG. 1, and the shape of the molten zone depends on the ratio of the moving speed of the single crystal 4 during the growing to the moving speed of the sintered rod material 3. Accordingly, when the molten zone is moved by about 5 mm, it assumes a constant shape. Then, the method of the present invention is applied.

The inventors have studied in preparatory tests the relation of an anode voltage in the oscillating tube to a radio-frequency current in a case that the shape of the material to be heated (molten zone) does not change. As a result, it has been found that they are substantially in proportional relationship ($A/V^\alpha$=constant). Accordingly, the optimum shape of molten zone can be always obtained by obtaining the proportion of the voltage and the current during the growing of the single crystal and by controlling power for heating on the basis of the judgement by the computer as to whether or not the shape of the molten zone is adequate to the value of the proportion.

When the power for heating to grow the single crystal is higher than the optimal value, the length of the molten zone becomes large. Since the density of the sintered rod material 3 is not 100%, the diameter of the sintered rod material at the molten zone 3' becomes small, hence the impedance between the work coil 5 and the molten zone becomes small, whereby a much amount of radio-frequency current is supplied. On the other hand, when the power for heating is lower than the optimal value, the opposite phenomenon appears. In accordance with an embodiment of the method of the present invention, a radio-frequency current and an anode voltage are respectively detected by the measuring devices 6, 7; the ratio of thus detected values is obtained by the operating unit 10; the shape of the molten zone is compared with a predetermined value so that judgment is made as to whether or not the shape is adequate; and the power for heating is controlled at the control unit 11 in the computer 8.

Another system of controlling the shape of the molten zone of the present invention will be described. When the diameter of the sintered rod material at the molten zone 3' becomes small at the time of growing of the single crystal, the impedance between the coil 5 and the molten zone becomes small, and a much amount of radio-frequency current is supplied. On the other hand, when the diameter at the molten zone 3' is relatively large, the radio-frequency current becomes small. Accordingly, it is possible that the radio-frequency current is detected by the measuring device 6; a change in the shape of the molten zone is judged at the operating unit 10 on the basis of the change of the radio-frequency current, and the power for heating is controlled at the control unit 11 in the computer 8.

In actual operations to automatically grow the single crystal, the relation of the radio-frequency current to be supplied to the coil 5 to the power for heating for the sintered rod material mainly depends on a material from which the single crystal is produced. Accordingly, data which have been obtained in the preparatory tests for growing the single crystal by manual operations are input in the memory of the computer, and such data are reflected in a program for various types of material to be used.

The above-mentioned first and second systems of controlling the shape of the molten zone may be used together to obtain good result.

In any case, it is important that the sintered rod material 3 melts into the molten zone 3' smoothly in order to obtain stable automatic growing of the single crystal. If the melting of the sintered rod material 3 is not smooth, the shape of the molten zone changes, hence the radio-frequency current changes, whereby it is impossible to control smoothly the power for heating. Accordingly, an important factor is to produce a straight sintered rod material having uniform diameter.

The computer 8 possesses output-stabilizing function wherein the anode voltage is maintained at a predetermined voltage level, in addition that it possesses power controlling function wherein an appropriate amount of power for heating is supplied. Namely, the anode voltage is detected by the measuring device 7 so that the detected value, is compared with a predetermined value and the radio-frequency generator 9 is feed-back-controlled on the basis of a result of comparison. The measuring device 7 is preferably of a digital type. Further, it is effective to use a constant voltage power source as the filament power source 12 for the radio-frequency generator 9 to keep the filament voltage constant.

In accordance with the method of present invention, the diameter of a single crystal produced is formed uniformly because the shape of molten zone is kept constant.

Several Examples of the method of the present invention will be described.

EXAMPLE 1

An example of growing a single crystal of $V_8C_7$ will be described.

It was confirmed in preparatory tests that the composition of the molten zone and the composition of the sintered rod material as a raw material should respectively be C/V=0.97 and C/V=0.877 in order to obtain a single crystal of $V_8C_7$.

A small amount of camphor as a binder was mixed with powder of vanadium carbide. A mixture was subjected to cold pressing to thereby form a square bar of 1×1×20 cm³. The square bar was rubber-pressed at an atmospheric pressure of 1,000 then and was formed in a cylindrical shape. Then, it was sintered at 2,000° C. in a vacuumed condition to prepare a sintered rod.

The sintered rod was fixed to an upper shaft through a holder in an FZ growing furnace. A single crystal <100> of vanadium carbide was fixed to a lower shaft, and a circular plate of carbon (about 0.05 g) was interposed between the sintered rod and the single crystal of vanadium carbides. He gas was filled at 7 atmospheric pressure in the growing furnace. The periphery of the circular plate of graphite was molten by radio-frequency heating to form an initially molten zone so that the sintered rod was molten into the molten zone at a rate of 1 cm/hr, and the growing of the single crystal was started at a rate of 0.75 cm/hr.

After the molten zone was moved by about 0.5 cm, the method of the present invention was applied so that automatic growing operation for a single crystal was conducted.

For heating of the molten zone, an anode voltage of 5 KV and a radio-frequency current of 190 A were supplied. For controlling the power for heating, the anode voltage was changed by several volts when the ratio of anode voltage to radio-frequency current (A/V) changed by 0.1% in order to automatically grow the single crystal.

Thus obtained single crystal of vanadium carbide had an uniform diameter (0.85 cm) and was 6.5 cm long. As a result of analysis, the carbon content in the starting portion, the middle portion and the end portion were respectively 17.13 wt %, 17.12 wt % and 17.08 wt % and the composition of these parts were respectively C/V=0.877, 0.876 and 0.874. The single crystal of vanadium carbide is known as a crystal which easily causes cracks. However, the single crystal obtained by the method of the present invention was free from cracks. It is likely that the reason why cracking can be prevented is because the single crystal has a uniform diameter and is grown without a rapid change of temperature.

EXAMPLE 2

An example of growing a single crystal of $TiC_{0.96}$ will be described. It was confirmed in preparatory tests that the composition of the molten zone and the composition of the sintered rod material as a raw material should respectively be C/Ti=1.3 and C/Ti=0.99 in order to obtain a good single crystal of titanium carbide.

A small amount of camphor as a binder was mixed with powder of titanium carbide. A mixture was subjected to cold pressing to form a square bar of $1\times1\times20$ cm$^3$. The square bar was rubber-pressed at an atmospheric pressure of 1,000. Then, the square bar was formed into a cylindrical shape and was sintered at 2,000° C. in a vacuumed condition to form a sintered rod.

The sintered rod was fixed to an upper shaft through a holder in an FZ growing furnace. A single crystal of titanium carbide <100> was fixed to a lower shaft, and a circular plate of carbon (about 0.05 g) was interposed between the sintered rod and the single crystal. He gas was filled at 7 atmospheric pressure in the growing furnace. The periphery of the circular plate of graphite was molten by radio-frequency heating to form an initially molten zone so that the sintered rod was molten into the molten zone at a rate of 1.2 cm/hr, and the growing of the single crystal was started at a rate of 1.0 cm/hr.

After the molten zone was moved by about 0.5 cm, the method of the present invention was applied so that initiate the automatic growing operation for a single crystal was conducted. An anode voltage of 6.069 KV and a radio-frequency current of 216.1 A were respectively supplied to heat the molten zone. In the case of growing the single crystal of TiC, when power for heating is higher than the optimum value, the width of the molten zone becomes large. Since the density of the sintered rod is not 100%, the diameter of the molten zone becomes small, hence the impedance between the work coil and the molten zone is small, and a much amount of radio-frequency current is supplied. On the other hand, when the power for heating is lower than the optimum value, the opposite phenomenon appears. Accordingly, control of the power for heating during automatic growing operations was conducted under Such condition that when the radio-frequency current changed by 0.2 A, the anode voltage was changed by 9 V so as to cancel a component of the change of the radio-frequency current.

In this Example, the following control was used jointly. Namely, the ratio of anode voltage to radio-frequency current was obtained at every 5 minute to detect the shape of molten zone. When the value of the ratio changed 0.02 more than the value of the ratio at the time of starting the automatic growing operations (=260.1/6.069), the anode voltage was changed by 5 V. Namely, when the value of the ratio exceeded 0.02 (when the diameter of the molten zone becomes small), the anode voltage was reduced by 5 V. In the opposite case, the anode voltage was increased by 5 V.

By conducting the above-mentioned control of power for heating, a stable movement of the molten zone was automatically carried out for 5 hours and 30 minutes, and the thus obtained single crystal of $TiC_{0.96}$ has a uniform diameter (0.9 cm) and was 6 cm long. With respect to the quality of the single crystal, the scattering in quality is small in comparison with the crystal obtained by manual operations and the quality was good. The reason why the single crystal having good quality is obtainable seems that the single crystal has an uniform thickness and is grown without a rapid change of temperature.

EXAMPLE 3

An example of growing a single crystal of $LaB_6$ will be described. Powder of $LaB_6$ was sintered in the same manner as Example 2 to form a sintered rod having a diameter of about 1 cm and a length of 20 cm. The sintered rod was fixed respectively to upper and lower shafts through BN holders in an FZ growing furnace. He gas was filled at 8 atmospheric pressure in the growing furnace. An initially molten zone and was formed by heating the sintered rod by radio-frequency heating. The movement of the molten zone was conducted by moving the sintered rod and the produced single crystal downwardly at a rate of 1 cm/hr.

After the molten zone was moved by about 0.5 cm, the method of the present invention was applied to thereby start automatic growing operations. As conditions for heating, an anode voltage of 5.609 KV and a radio-frequency current of 200.7 A were respectively supplied.

In case of growing the single crystal of $LAB_6$, the molten zone is apt to fall in comparison with the case of TiC in Example 2. Therefore, it was necessary to adjust the power of heating even by a small change of radio-frequency current. Namely, when the radio-frequency current increased by 0.1 A, the anode voltage was reduced by 4 V. Further, when the radio-frequency current decreased by 0.1 A (when the diameter of the molten zone was relatively thick), the anode voltage was decreased by 3.5 V in the same manner because the molten zone was apt to fall. Consequently, the power for heating decreased with the movement of the molten zone. This is because the melting point of the molten zone decreases with the movement of the radio due to a change in the composition of the molten zone because of evaporation. When the automatic growing operations for 5 hours was finished, the molten zone was heated by supplying an anode voltage of 5.474 V and a radio-frequency current of 195.2 A.

Thus, a single crystal of $LaB_6$ having a diameter of 8 mm and a length of 5.5 cm was obtained. The surface area of a single crystal formed by manual operations is not smooth since the growing operations were conducted under the condition that the molten zone is apt to fall. However, the surface area of the single crystal obtained by the automatic growing operations is extemely smooth since fine control of power for heating is obtainable. In quality, the scattering is small in the same manner as TiC in Example 2 and the quality is good.

Thus, in accordance with the present invention, the shape of a molten zone is judged by comparing an anode voltage in a radio-frequency oscillating tube with a radio-frequency current in a case that a single crystal is to be formed by utilizing an FZ method in which radio-frequency induction heating is used. Or the shape of the molten zone is judged on the basis of a change of the radio-frequency current. Power for heating a material to be heated is controlled on the basis of the judgment. Accordingly, there is obtainable a single crystal having high quality and of a lower cost by controlling temperature smoothly.

Obviously, numerous modifications and variations of the present invention are possible in light of the above teachings. It is therefore to be understood that within the scope of the appended claims, the invention may be practiced otherwise than as specifically described herein.

What is claimed is:

1. A method of automatically growing a single crystal by using a floating-zone method in which a radio-frequency induction heating coil is utilized comprising the steps of:

monitoring the shape of a molten zone, after the formation thereof, only by comparing an anode voltage, in a radio-frequency oscillation tube, with a measured radio-frequency current flowing through said radio-frequency inducting heating coil, and automatically adjusting the power for heating on the basis of the monitored comparison during and after the start of movement of said molten zone.

2. The method according to claim 1, wherein the comparison of the anode voltage in the radio-frequency oscillation tube with the radio-frequency current is conducted by taking a ratio of the radio-frequency current to the anode voltage.

3. A method of automatically growing a single crystal by using a floating-zone method in which a radio-frequency induction heating coil is utilized, comprising the steps of:

monitoring any change in the shape of molten zone, after the formation thereof, only depending on a change in a radio-frequency current flowing through said radio-frequency induction heating coil during the crystal growth from the sintered rod material; and automatically adjusting the power used for heating on the basis of the monitored change in the shape of molten zone during and after the start of movement of said molten zone.

4. The method according to claim 3, which further comprises:

monitoring the shape of molten zone by way of a comparison of an anode voltage in a radio-frequency oscillation tube with the radio-frequency current flowing through said radio-frequency induction heating coil; and controlling the power for heating on the basis of the monitored comparison.

* * * * *